United States Patent
Cho et al.

(10) Patent No.: US 7,602,005 B2
(45) Date of Patent: Oct. 13, 2009

(54) MEMORY DEVICES INCLUDING SPACER-SHAPED ELECTRODES ON PEDESTALS AND METHODS OF MANUFACTURING THE SAME

(75) Inventors: Byung-Kyu Cho, Seoul (KR); Tae-Yong Kim, Suwon-si (KR); Choong-Ho Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 197 days.

(21) Appl. No.: 11/759,044

(22) Filed: Jun. 6, 2007

(65) Prior Publication Data

US 2008/0001211 A1    Jan. 3, 2008

(30) Foreign Application Priority Data

Jun. 28, 2006  (KR)  ...................... 10-2006-0058395

(51) Int. Cl.
*H01L 27/115* (2006.01)
(52) U.S. Cl. ............................... 257/315; 257/E27.103
(58) Field of Classification Search ................. 257/261, 257/298, 314, 315, E21.679, E27.103
See application file for complete search history.

(56) References Cited

U.S. PATENT DOCUMENTS

| | | | |
|---|---|---|---|
| 5,834,808 A | 11/1998 | Tsukiji | |
| 6,204,529 B1 | 3/2001 | Lung et al. | |
| 6,555,866 B1 * | 4/2003 | Kuo | ........................... 257/314 |
| 6,649,972 B2 | 11/2003 | Eitan | |
| 2003/0209767 A1* | 11/2003 | Takahashi et al. | ........... 257/390 |
| 2005/0224847 A1 | 10/2005 | Masuoka et al. | |
| 2005/0259479 A1* | 11/2005 | Yamanaka et al. | ..... 365/189.05 |

FOREIGN PATENT DOCUMENTS

| | | |
|---|---|---|
| JP | 2003-332469 A | 11/2003 |
| JP | 2005-268418 A | 9/2005 |

* cited by examiner

*Primary Examiner*—Thomas L Dickey
(74) *Attorney, Agent, or Firm*—Myers Bigel Sibley & Sajovec, P.A.

(57) ABSTRACT

A NOR flash memory device includes a substrate having trenches that extend in a first direction and stepped portions that are arranged between the trenches. A bit region having a linear shape extends in a second direction substantially perpendicular to the first direction in the substrate. The bit region is doped with impurities. A first dielectric layer is on the substrate having the trenches. An electric charge trap layer is on the first dielectric layer. A second dielectric layer is on the electric charge trap layer. An upper electrode is on sidewalls of the trenches. The upper electrode has a spacer shape. Related fabrication methods are also described.

22 Claims, 12 Drawing Sheets

MEMORY DEVICES INCLUDING SPACER-SHAPED ELECTRODES ON PEDESTALS AND METHODS OF MANUFACTURING THE SAME

CROSS-REFERENCE TO RELATED APPLICATION

This application claims the benefit under 35 USC §119 of Korean Patent Application No. 10-2006-0058395, filed on Jun. 28, 2006, the disclosure of which is hereby incorporated herein by reference in its entirety as if set forth fully herein.

FIELD OF THE INVENTION

The present invention relates to memory devices and methods of manufacturing the same. More particularly, example embodiments of the present invention relate to charge trap type NOR flash memory devices and methods of manufacturing these NOR flash memory devices.

BACKGROUND OF THE INVENTION

Integrated circuit (semiconductor) memory devices are widely used in many consumer, commercial and other applications. Semiconductor memory devices may be divided into volatile memory devices and non-volatile memory devices. The volatile memory devices, such as dynamic random access memory (DRAM) devices and static random access memory (SRAM) devices may have a relatively rapid input/output speed, but data stored therein generally disappears when power is removed. On the other hand, non-volatile memory devices such as a read only memory (ROM) may have a relatively slow input/output speed, but data stored therein may be kept relatively permanently.

Electrically erasable programmable read only memory (EEPROM) devices, such as flash memory devices, are being widely used. Flash memory devices may perform programming and erasing of data using a Fowler-Nordheim tunneling or a channel hot electron implantation. In addition, flash memory devices may be largely divided into a floating gate type including a floating gate for storing electric charges and an electric charge trapping type.

Various attempts to improve the integration degree of these devices have been carried out. For example, a non-volatile memory device including a single control gate and two floating gates is disclosed in U.S. Pat. No. 5,834,808 to Tsukiji. A 2 bit non-volatile memory device, which includes two diffusion regions formed on a substrate, a channel formed between the two diffusion regions and an oxide-nitride-oxide (ONO) layer, is illustratively disclosed in U.S. Pat. No. 6,649,972 to Eitan. According to U.S. Pat. No. 6,649,972, the oxide-nitride-oxide layer includes a first oxide layer, a nitride layer and a second oxide layer. The nitride layer has a thickness of no more than about 100 Å and also includes two regions for storing electric charges.

In spite of the various attempts described above, it is desirable to further improve the integration density. Particularly, the above-mentioned patents can increase a storage density of data by providing a structure of the floating gate or a method of using a nitride layer for data storage. However, since the floating gate and the nitride layer are formed in a plane direction, a reduction in a dimension of the non-volatile memory device may be difficult.

SUMMARY OF THE INVENTION

Memory devices according to various embodiments of the present invention comprise a substrate including closely spaced apart trenches that extend in a first direction to define closely spaced apart pedestals therebetween that extend in the first direction. A respective pedestal includes opposing sidewalls and a pedestal top therebetween. A plurality of spaced apart bit lines are also provided in the substrate that extend in a second direction across the spaced apart trenches and across the pedestals therebetween, and that extend in a respective pedestal along the opposing sidewalls and along the pedestal top. A plurality of spaced apart electrodes are provided on the plurality of opposing sidewalls, that extend in the first direction and that are thicker remote from the pedestal tops than adjacent the pedestal tops. A plurality of memory cells is located at intersections of the bit lines and the electrodes.

In some embodiments, the memory cells include a charge trap region, also referred to herein as an electric charge trap region. In other embodiments, the electrodes monotonically increase in thickness from adjacent the pedestal tops to remote from the pedestal tops. In still other embodiments, the electrodes have a cross-sectional shape of a gate sidewall spacer of a field effect transistor. In still other embodiments the substrate, bit lines, electrodes and/or memory cells are configured to provide a NOR flash memory device.

In other embodiments, these memory devices also include a first insulating layer that extends on the trenches and on the pedestals, including on the opposing sidewalls and pedestal tops thereof. A charge trap layer is provided on the first insulating layer, and a second insulating layer is provided on the charge trap layer. The closely spaced apart electrodes are provided on the second insulating layer on the plurality of opposing sidewalls, and the charge trap layer defines the charge trap region. In still other embodiments, a third insulating layer is provided on the pedestal tops, and a mask layer is provided on the third insulating layer. In these embodiments, the first insulating layer is on the mask layer on the pedestal tops.

In still other embodiments, alternating ones of the plurality of closely spaced apart electrodes on the plurality of opposing sidewalls extend in the first direction for alternating different distances. In some embodiments, an array of common contacts is provided, a respective one of which electrically connects a pair of closely spaced apart electrodes on facing sidewalls of adjacent pedestals. In other embodiments, an array of contacts is provided, a respective one of which electrically contacts a respective one of the closely spaced apart electrodes.

NOR flash memory devices in accordance with some embodiments of the present invention include a substrate, a bit region, a first dielectric layer, an electric charge trap layer, a second dielectric layer and an upper electrode. The substrate has trenches extending in a first direction and a stepped portion (i.e., a pedestal) between the trenches. The bit region has a linear shape extending in a second direction substantially perpendicular to the first direction. Further, the bit region is doped with impurities. The first dielectric layer is on the substrate having the trenches. The electric charge trap layer is on the first dielectric layer. The second dielectric layer is on the electric charge trap layer. The upper electrode has a sidewall spacer shape and is provided on sidewalls of the trenches.

According to some embodiments of the present invention, one pitch including a single trench and a single stepped portion may have a length of at least twice a width of a minimum line patterned by a photolithography process for the device.

According to other embodiments, the bit region may have a linear shape that includes the sidewalls and a bottom surface of the trench and a surface of the stepped portion into which the impurities are doped.

According to still other embodiments, an insulation layer pattern and a mask pattern may be provided on the stepped portion of the substrate.

According to yet other embodiments, contacts for applying a signal may be provided on end portions of the upper electrodes. The end portions of the upper electrodes may be arranged at positions different from each other.

Additionally, the NOR flash memory devices may further include selection transistors arranged on the end portions of the upper electrodes and connected to the upper electrodes, and contacts that are configured to apply a signal to the selection transistors. Further, a given contact may be simultaneously connected to impurity regions of at least two selection transistors adjacent to each other.

According to still other embodiments of the invention, in methods of manufacturing NOR flash memory devices, a substrate is etched to form trenches extending in a first direction and stepped portions between the trenches. Impurities are doped into the substrate to form a bit region having a linear shape extending in a second direction substantially perpendicular to the first direction. A first dielectric layer, an electric charge trap layer and a second dielectric layer are successively formed on the substrate having the trenches. An upper electrode having a spacer shape is formed on sidewalls of the trench.

In some embodiments of the present invention, one pitch including a single trench and a stepped portion may have a length substantially the same as a minimum line width patterned by a photolithography process for the manufacturing methods.

In methods of forming the bit region according to some embodiments of the invention, a first mask pattern having a linear shape extending in the second direction may be formed on the substrate. Impurities are primarily doped into the substrate between the first mask patterns to form a preliminary bit region. A second mask pattern having a linear shape extending in the first direction is formed on the substrate. The substrate is etched using the first and the second mask patterns as an etching mask to form preliminary trenches. Impurities are secondarily doped into sidewalls and bottom surfaces of the preliminary trenches to form the bit region, which has a linear shape extending in the second direction and is connected to the preliminary bit region.

The first and the second mask patterns may include substantially the same material, and the second mask pattern may have a thickness greater than that of the first mask pattern.

An insulation layer pattern having an upper surface that has a level substantially the same as that of the first mask pattern may be formed in a gap between the first mask patterns after the preliminary bit region is formed.

The impurities may be secondarily doped by a plasma doping process to complete the bit region.

In methods of forming the trenches and the stepped portions on the substrate, according to some embodiments, the preliminary trenches are filled up with an insulation layer pattern. The first mask pattern is removed to partially expose the substrate, with the second mask pattern being left over. Then, the exposed substrate is partially removed to form the trenches connected to the preliminary trenches.

In methods of forming the insulation layer pattern, according to some embodiments, an insulation layer is formed on the second mask pattern to fill up the preliminary trenches with the insulation layer. The insulation layer is planarized until the second mask pattern is exposed to form a preliminary insulation layer pattern. The preliminary insulation layer pattern is etched until a surface of the first mask pattern is exposed to form the insulation pattern.

After the trenches are formed, impurities may be further doped into a channel region to control a threshold voltage.

After the trenches are formed, the insulation layer pattern may be further removed.

After the upper electrodes are formed, an insulation interlayer may be further formed on the upper electrodes, and contacts making contact with end portions of the upper electrodes may be further formed in the insulation interlayer.

Before the insulation interlayer is formed, the upper electrodes may be further partially etched to arrange the end portions of the upper electrodes at positions different from each other.

In other embodiments, after the upper electrodes are formed, selection transistors connected to the upper electrodes may be further formed. An insulation interlayer may be further formed on the upper electrodes and the selection transistors. Contacts may be further formed in the insulation interlayer to apply a signal to the selection transistors.

In some embodiments of the present invention, a single contact may be concurrently connected to impurity regions of at least two adjacent selection transistors.

In still other embodiments of the present invention, the upper electrodes may be formed by forming a conductive layer on the sidewalls and tops of the stepped portions and on the trench floors therebetween. The conductive layer is then anisotropically etched to form sidewall spacer-shaped upper electrodes on the sidewalls of the stepped portions.

According to some embodiments of the present invention, the channel regions are formed under sidewalls of the trenches in the substrate and upper electrodes having a sidewall spacer shape are formed on the sidewalls of the trenches. Thus, an integration degree of the NOR flash memory device may be increased.

BRIEF DESCRIPTION OF THE DRAWINGS

The above and other features and advantages of the present invention will become more apparent by describing in detailed example embodiments thereof with reference to the accompanying drawings, in which.

DETAILED DESCRIPTION

Figure 1:
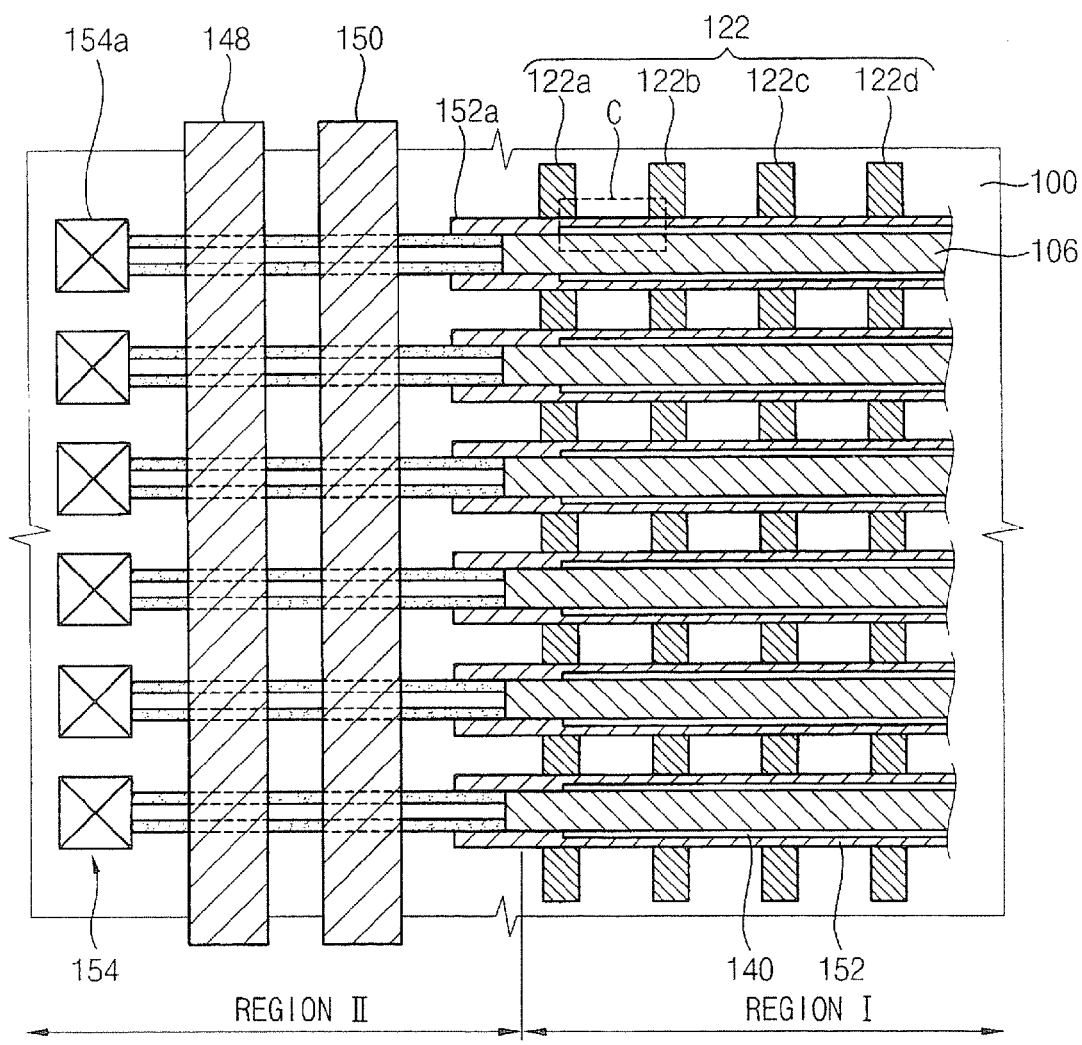
FIG. 1 is a plan view illustrating a NOR flash memory device in accordance with first embodiments of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper," "top," "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes," "including" and variants thereof, when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, various embodiments of the present invention will be explained in detail with reference to the accompanying drawings.

Figure 2:
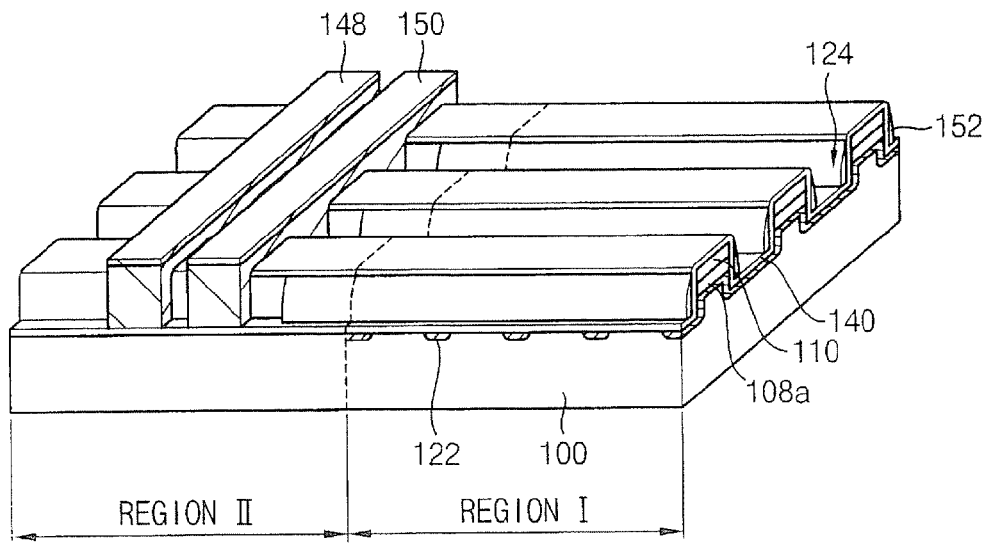
FIG. 2 is a perspective view illustrating a portion of a NOR flash memory device of FIG. 1.

FIG. 1 is a plan view illustrating a NOR flash memory device in accordance with first embodiments of the present invention. FIG. 2 is a perspective view illustrating a portion of a NOR flash memory device of FIG. 1.

Referring to FIGS. 1 and 2, a single crystalline silicon substrate 100 is provided. However, other conventional single layer or multilayer microelectronic substrates may be used.

The substrate 100 is divided into a first region (I) in which cells for storing data are formed and a second region (II) in which elements for selecting the cells are formed.

Hereinafter, detailed descriptions of the first region will be provided.

Trenches 124 and stepped portions (i.e., pedestals) are formed at a surface of the first region in the substrate 100. The trenches 124 extend in a first direction. The stepped portions are formed between the trenches 124. The trenches 124 and the stepped portions are alternately arranged. The respective pedestals (stepped portions) include opposing sidewalls and a pedestal top therebetween.

One pitch including a single trench 124 and a single stepped portion may have a length of at least twice a width of a minimum line width (hereinafter referred to as "F") patterned by a photolithography process that is used to fabricate the device. In this case, the NOR flash memory according to these embodiments of the present invention may store 4 bits per dimension of $4F^2$.

A silicon oxide layer pattern 108a and a mask pattern 110 are stacked on the stepped portion of the substrate. In some embodiments, the mask pattern 110 may include silicon nitride. Further, the mask pattern 110 may serve as an ion implantation mask and an etching mask.

A bit region 122 doped with impurities has a linear shape extending in a second direction, which is substantially perpendicular to the first direction in some embodiments. In some embodiments of the present invention, the bit region 122 may be formed by doping impurities into the substrate 100. Further, the bit region 122 may be doped with N-type impurities having a high concentration. In some embodiments, since the bit region 122 serves as a bit line, forming an additional bit line, an additional bit line contact and additional impurity regions may not be required.

The bit regions 122 are repeatedly arranged spaced apart from each other by a predetermined distance.

The bit regions 122 are positioned under sidewalls and a bottom surface of the trench 124 of the substrate 100, and under surfaces of the stepped portions. In other words, they extend across the spaced apart trenches and across the pedestals therebetween. In a respective pedestal, they extend along the opposing sidewalls and the pedestal top. Accordingly, when an external electric signal is applied to an end portion of the bit region 122, the electric signal is transmitted into a selected bit region 122 extending in the second direction.

A channel region is formed between the bit regions 122. Further, the channel region may be doped with P-type impurities.

A first dielectric layer is formed on the substrate 100 having the trenches 124 and the stepped portions. The first dielectric layer serves as a tunnel oxide layer. In some embodiments, the first dielectric layer may include silicon oxide formed by thermally oxidizing the semiconductor substrate 100.

An electric charge trap layer for trapping electric charges is formed on the first dielectric layer. The electric charge trap layer may include silicon nitride, a nanocrystal material, etc. Examples of the nanocrystal material may include silicon (Si), silicon germanium (SiGe), tungsten (V), cobalt (Co), molybdenum (Mo), cadmium selenium (CdSe), tungsten nitride (WN), etc. In some specific embodiments of the present invention, the electric charge trap layer includes silicon nitride.

A second dielectric layer as a blocking layer is formed on the electric charge trap layer. For example, the second dielectric layer may include silicon oxide.

Referring to FIGS. 1 and 2, a stacked structure where the first dielectric layer, the electric charge trap layer and the second dielectric layer are stacked is indicated as reference numeral 140.

An upper electrode 152, also referred to herein simply as an electrode, having a spacer shape, is formed on the sidewalls of the trenches 124. For example, the upper electrode 152 may include polysilicon doped with impurities. The spacer shape is illustrated in FIG. 2. As is well known to those having skill in the art, a spacer is commonly used on sidewalls of gate electrodes of field effect transistors, and generally is thicker remote from the pedestal or gate electrode top than adjacent the gate electrode or pedestal top. In some embodiments, the electrode monotonically increases in thickness from adjacent the pedestal top to remote from the pedestal top.

As the upper electrode 152 has the spacer shape, the upper electrode 152 may have a much smaller line width than an electrode formed by using a conventional photolithography process. Particularly, since the two adjacent upper electrodes 152 may be formed facing one another in a single trench 124, memory devices of some embodiments may have an integration degree of about twice that of a conventional memory device. As a result, formation of one cell (C) per dimension of $2F^2$ may be feasible.

Additionally, two data bits may be read and written in every unit cell in accordance with input and output directions of the data. Accordingly, two data bits per dimension of $4F^2$ may be read and written. Data input/output in the unit cell will be illustrated later.

Detailed descriptions of the second region (II) will now be provided.

The second region is arranged adjacent to an end portion of the upper electrode 152. Selection transistors, which selectively operate the upper electrodes 152 in response to an external applied signal, are formed in the second region. Additionally, a contact 154 for applying an external electric signal to the selection transistor is formed on the second region.

A first impurity region of the selection transistor is connected to the contact 154 for applying the external signal to the selection transistors, and a second impurity region of the selection transistor is connected to the end portion of the upper electrode 152. The selection transistor has a first impurity region connected to the contact 154 and a second impurity region connected to the end portion of the upper electrode 152. Further, a gate oxide layer and first and second gate electrode lines 148 and 150 are formed on substrate between the first impurity region and the second impurity region.

Furthermore, any one among the contacts 154 may be simultaneously connected to the first impurity region of at least two adjacent selection transistors.

Hereinafter, a selection transistor according to these embodiments of the present invention will be explained in detail.

Trenches 124 and stepped portions are formed at a surface of the second region in the substrate 100 similar to the first region.

A first impurity region, a second impurity region and a channel region of the selection transistor are positioned under sidewalls of the trench 124. The upper electrode 152 having a spacer shape is extended to a surface of the second impurity region, such that the second impurity region and the upper electrode 152 are connected to each other.

The first gate electrode line 148 and a second gate electrode line 150 having a linear shape extend in the first direction. The first gate electrode line 148 and the second gate electrode line 150 selectively drive the upper electrodes 152.

The selection transistor may include the first gate electrode line 148, and the first and second impurity regions formed at both sides of the first gate electrode line 148. Alternatively, the selection transistor may include the second gate electrode line 150, and the first and second impurity regions formed at both sides of the second gate electrode line 150.

A first group of the selection transistors including the first gate electrode line 148 and the first and second impurity regions at both sides of the first gate electrode line 148 is provided to select a plurality of odd numbered upper electrodes 152 on the first region.

Further, a second group of the selection transistors including the second gate electrode line 150 and the first and second impurity regions at both sides of the second gate electrode line 150 is provided to select a plurality of even numbered upper electrodes 152 on the first region.

An insulation interlayer (not illustrated) is formed on the first region and the second region of the substrate 100 to cover the upper electrode 152, the first gate electrode line 148 and the second gate electrode line 150.

The contacts 154 connected to the first impurity region of the selection transistors are formed in the insulation interlayer. A given one of the contacts 154 is simultaneously connected to the first impurity regions of two adjacent selection transistors. That is, the contact 154 simultaneously makes contact with two adjacent sidewalls of the trench 124 in the substrate 100.

When an electric signal is simultaneously applied to the two first impurity regions, only one between the first gate electrode line 148 and the second gate electrode line 150 is selectively tuned on, thereby selectively applying an electric signal to only one predetermined upper electrode 152.

As illustrated above, according to some embodiments of the invention, as the line width of the upper electrode of the NOR flash memory devices is reduced, the integration density may increase.

Additionally, in some embodiments, as the selection transistor is connected to the one portion of the upper electrode, the two upper electrodes may be selectively controlled by the single contact. Accordingly, the number of the contacts for applying an external signal may be reduced compared to a conventional memory device. Therefore, the external electrical signal may be selectively applied to each of the upper electrodes although the number of the unit cells formed on the first region may be increased.

As mentioned above, NOR flash memory devices in accordance with these embodiments of the present invention may program or read 2 bit data on a unit cell. Hereinafter, a method of programming and reading the 2 bit data on a unit cell is explained in detail.

Referring to FIG. 1, for example, a method of programming and reading 2 bit data in a first cell (C) will be explained.

First, a method of programming and reading first data on a first cell (C) is explained.

A programming voltage (Vp1) is applied to a first bit region (hereinafter, referred to as "bit region (1), 122a") and a first upper electrode (hereinafter, referred to as "upper electrode (1), 152a"), respectively. The other bit regions 122b, 122c, and 122d except for the bit region (1) 122a are maintained at a ground level or do not apply a voltage (i.e., floating).

When a voltage is applied to the first contact 154a and the first gate electrode line 148, respectively, a first selection transistor connected to the upper electrode (1) 152a is turned on to apply the voltage to the upper electrode (1) 152a.

Accordingly, the programming voltage Vp1 is applied to the upper electrode (1) 152a to form a first channel between the bit region (1) 122a and the bit region (2) 122b adjacent to the bit region (1) 122a. Electric charges move from the bit region (2) 122b to the bit region (1) 122a by the programming voltage Vp1 applied to the bit region (1) 122a. Here, as the electric charges move closer to the bit region (1) 122a, a velocity of the electric charges is increased and at least some of the electric charge is implanted into the electric charge trap layer.

By the above-mentioned programming method, the electric charges are implanted into a portion of the electric charge trap layer, i.e., a first storage region adjacent to the bit region (1) 122a.

On the other hand, when the programming voltage Vp1 is applied to the upper electrode (1) 152a to form channels between the remaining bit regions 122b, 122c, and 122d, electrons do not move through each of the channels because the voltage is not applied to the bit regions 122b, 122c, and 122d.

Accordingly, the first data may be programmed in the first storage region of the unit cell (C) arranged between the bit region (1) 122a and the bit region (2) 122b.

In order to read the first data programmed on the first storing region, reading voltages Vr1 and Vr2 are applied to the upper electrode (1) 152a and the bit region (2) 122b, and the bit region (1) 122a is grounded. Here, a reading voltage substantially the same as the reading voltage applied to the bit region (2) 122b is applied to the remaining bit regions 122c and 122d to reduce or prevent electrons from moving.

When the electric charges are not stored in the first electric charge storage region, substantial electric current will flow through the channel at a reading voltage state owing to a relatively low threshold voltage of the first storing region. On the other hand, when the electric charges are stored in the first electric charge storage region, substantial electric current will not flow through the channel at the reading voltage state owing to a relatively high threshold voltage of the first storing region. Therefore, the data of the first electric charge storage region may accurately be read by measuring the current in the channel.

A method of programming and reading second data on a first cell (C), according to some embodiments of the invention, is explained hereinafter.

A programming voltage is applied to a second bit region (hereinafter, referred to as "bit region (2), 122b") and a first upper electrode (hereinafter, referred to as "upper electrode (1), 152a") respectively. The bit region (1) may be maintained at the ground level. In addition, the programming voltage of the bit region (2) is applied to the remaining bit regions 122c and 122d. The voltage is applied to the first contact, and the first selection transistor connected to the upper electrode (1) is turned on, to thereby apply the voltage to the upper electrode (1).

Accordingly, the programming voltage Vp1 is applied to the upper electrode (1) 152a to form a first channel between the bit region (1) 122a and the bit region (2) 122b adjacent to the bit region (1) 122a. Electric charges move from the bit region (1) 122a to the bit region (2) 122b by the programming voltage Vp1 applied to the bit region (2) 122b. Here, as the electric charges move closer to the bit region (2) 122b, the velocity of the electric charges is increased and at least some of the electric charge is implanted into the electric charge trap layer. Accordingly, the electric charges are implanted into a portion adjacent to the bit region (2) 122b, which is also referred to as a second storage region.

On the other hand, while the programming voltage Vp1 is applied to the upper electrode (1) 152a to form channels among the remaining bit regions 122c and 122d respectively, electrons do not move through each of the channels because the bit regions 122c and 122d have the same voltage level as the bit region (2).

Accordingly, the second data may be programmed on the second storing region of the unit cell (C) arranged between the bit region (1) 122a and the bit region (2) 122b.

In order to read the second data programmed on the second storing region, reading voltages Vr1 and Vr2 are applied to the upper electrode (1) 152a and the bit region (1) 122a, and the bit region (2) 122b is grounded. Here, the remaining bit regions 122c and 122d are grounded to reduce or prevent electrons from moving.

When the electric charges are not stored in the second electric charge storage region, substantial electric current may flow through the channel at a reading voltage state owing to the relatively low threshold voltage. On the other hand, when the electric charges are stored in the second electric charge storage region, substantial electric current does not flow through the channel at the reading voltage state by the relatively high threshold voltage. Therefore, the data of the second electric charge storage region may accurately be read by measuring the current of the channel.

As mentioned above, NOR flash memory devices according to these embodiments of the present invention may program and read 2 bit data on one cell formed between the bit region (1) and the bit region (2).

Hereinafter, a method of forming the above-described NOR flash memory devices will be explained in detail.

FIGS. 3 to 16 are perspective views illustrating a NOR flash memory device shown in FIG. 1. FIG. 17 is a cross-sectional view illustrating a NOR flash memory device shown in FIG. 1.

Figure 3:
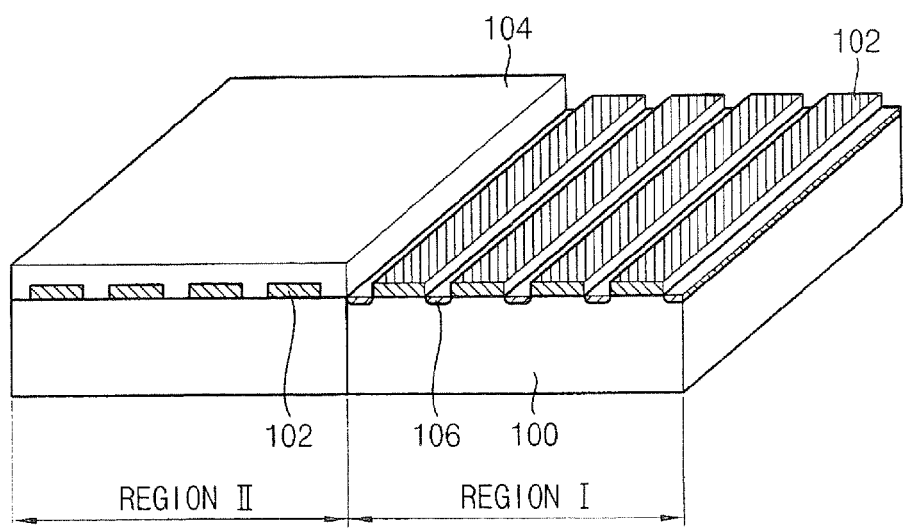
FIGS. 3 to 16 are perspective views illustrating methods of manufacturing a NOR flash memory device of FIG. 1.

Referring to FIG. 3, a substrate 100 including, for example, single crystalline silicon is provided. The substrate 100 is divided into a first region (I) on which NOR flash memory cells are formed and a second region (II) on which circuits for selecting upper electrodes formed in the cells are formed.

A first hard mask pattern 102 is formed on the substrate 100 divided into the first and the second regions. Then, impurities are implanted into the first region using the first hard mask pattern 102 as an ion implantation mask to form a first preliminary bit region 106.

In these embodiments, a pad oxide layer (not illustrated) may be formed on the substrate 100 by a chemical vapor deposition (CVD) process and/or a thermal oxidation process. A first silicon nitride layer (not illustrated) is formed on the pad oxide layer. The first silicon nitride layer may be formed by a low pressure chemical vapor deposition (LPCVD) process using a dichlorosilane ($SiH_2Cl_2$) gas, a silane ($SiH_4$) gas, ammonia ($NH_3$) gas, etc., and/or by a plasma enhanced chemical vapor deposition (PECVD) process.

A first photoresist pattern (not illustrated in the figure) is formed on the first silicon nitride layer to selectively expose a portion of the first silicon nitride layer corresponding to a bit region formed by a following process. The first silicon nitride layer is etched using the first photoresist pattern as an etching mask to form the first hard mask pattern 102. The first hard mask pattern 102 has a linear shape extending in the second direction substantially the same as the extending direction of the bit region.

Then, the first photoresist pattern may be removed by an ashing process and/or a stripping process.

As mentioned above, after the first hard mask pattern 102 is formed on the first region and the second region, a second photoresist pattern 104 is formed to cover the second region.

N-type impurities having a high concentration are implanted into the surface of the substrate by using the second photoresist pattern 104 and the first hard mask pattern 102 as an ion implantation mask. By the above-mentioned process, the first preliminary bit region 106 having the linear shape extending in the second direction is formed on the first region.

After the first preliminary bit region 106 is formed, the second photoresist pattern 104 is removed by an ashing process and/or a stripping process.

Figure 4:
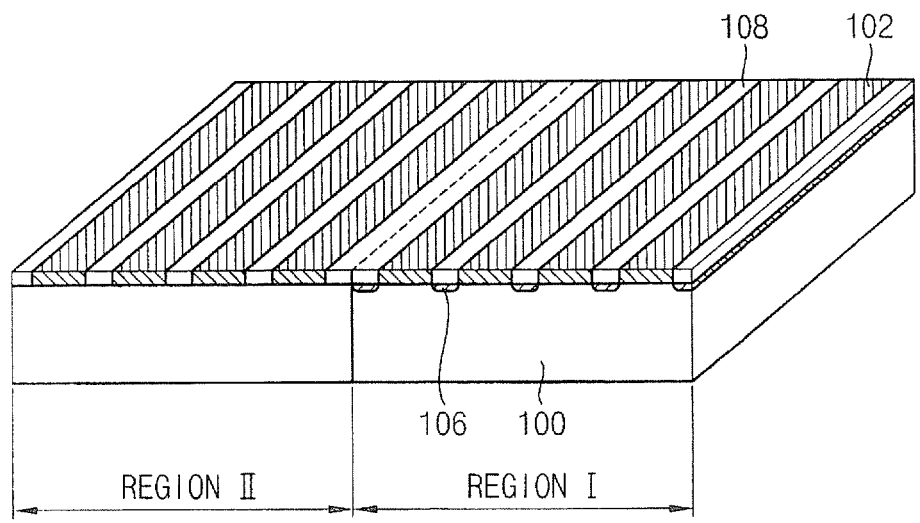

Referring to FIG. 4, spaces between the first hard mask patterns 102 are filled with a first silicon oxide layer (not illustrated). The silicon oxide layer may include an undoped silicate glass (USG) oxide layer, a plasma enhanced tetra-ethylortho-silicate (PE-TEOS) oxide layer, a high density plasma (HDP) oxide, etc.

Then, the first silicon oxide layer is chemically and physically planarized to expose an upper surface of the first hard mask pattern 102. Thus, the first silicon oxide layer is changed into a first preliminary silicon oxide pattern 108 substantially parallel with the first hard mask pattern 102. In addition, in some embodiments, the first preliminary silicon oxide pattern 108 and the first hard mask pattern have flat surfaces without a stepped portion.

Figure 5:
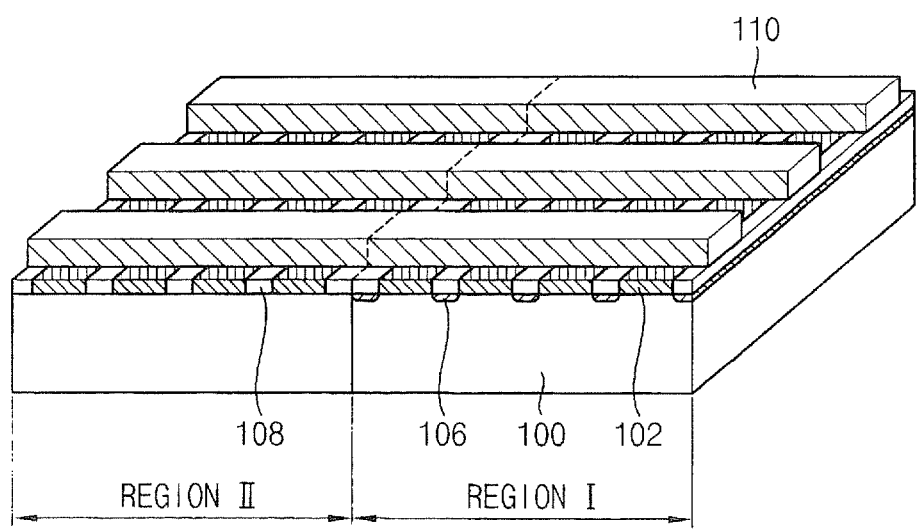

Referring to FIG. 5, a second silicon nitride layer (not illustrated) is formed on the first hard mask pattern 102 and the first preliminary silicon oxide layer pattern 108. The second silicon nitride layer may have a thickness greater than that of the first hard mask pattern 102.

A linear third photoresist pattern (not illustrated) extending in a direction substantially perpendicular to an extending direction of the first hard mask pattern 102 is formed on the second silicon nitride layer. The second silicon nitride layer is etched by using the third photoresist pattern as an etching mask to form a second hard mask pattern 110.

Then, the third photoresist pattern is removed by an ashing process and/or a stripping process.

Figure 6:
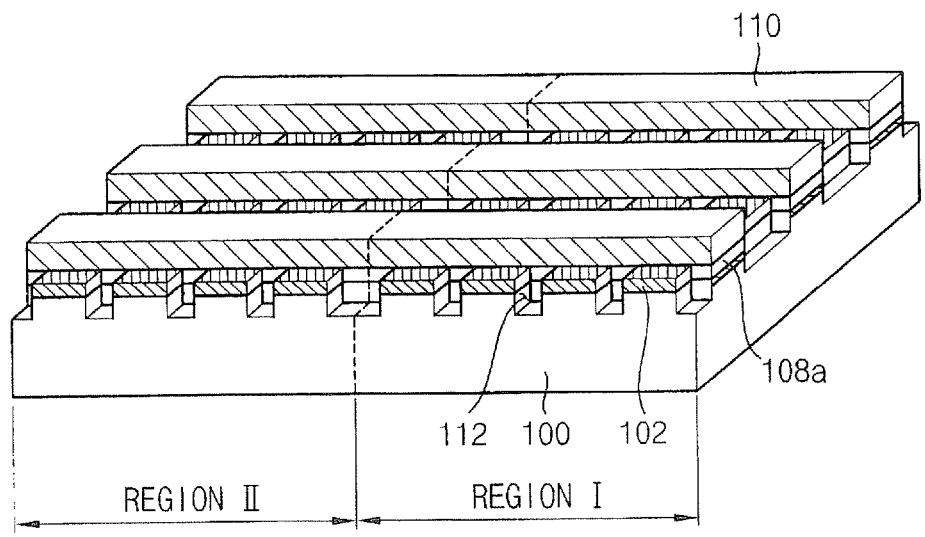

Referring to FIG. 6, the exposed first preliminary silicon oxide pattern 108 is anisotropically etched using the first and the second hard mask patterns 102 and 110 as etching masks.

As a result, a first silicon oxide layer pattern 108a having an isolated shape is formed under the second hard mask pattern 110. In addition, the substrate 100 is exposed through the first and the second hard mask patterns 102 and 110.

Then, the exposed substrate 100 is etched using the first and the second hard mask patterns 102 and 110 as etching masks to form openings 112 defined by the first and the second mask patterns 102 and 110. In addition, one portion of the first preliminary bit region 106 is still left on the surface of the substrate under the second hard mask pattern 110 and another remaining portion of the first preliminary bit region 106 is removed from the substrate 100 by the etching process.

Figure 7:
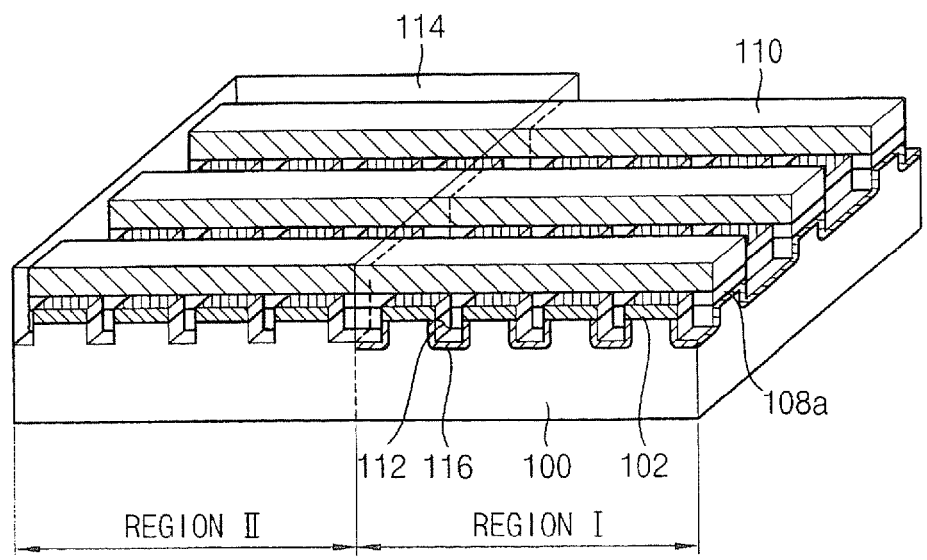

Referring to FIG. 7, a photoresist film (not illustrated) is formed on the substrate 100 having the openings. The photoresist film is then exposed and developed to form a fourth photoresist pattern 114 for masking the second region. Then, N-type impurities having a high concentration are implanted into the substrate 100 using the fourth photoresist pattern 114, the first and the second mask patterns 102 and 110 as an ion implantation mask. Accordingly, the impurities are doped into sidewalls and a bottom surface of the openings 112 in the first region. In this example embodiment, the impurity doping process may be performed by a plasma doping process. While the plasma doping process is performed, the impurities are doped conformal to a profile of the sidewalls and the bottom surface of the openings 112, to thereby form a relatively uniform junction depth from the surfaces of the openings 112 in the first region.

As a result, an impurity region where impurities are doped into the sidewalls and the bottom surface of the opening 112 is connected to the first preliminary bit region 106 to form a second preliminary bit region 116.

After forming the second preliminary bit region 116, the fourth photoresist pattern is removed by an ashing process and/or a stripping process.

Figure 8:
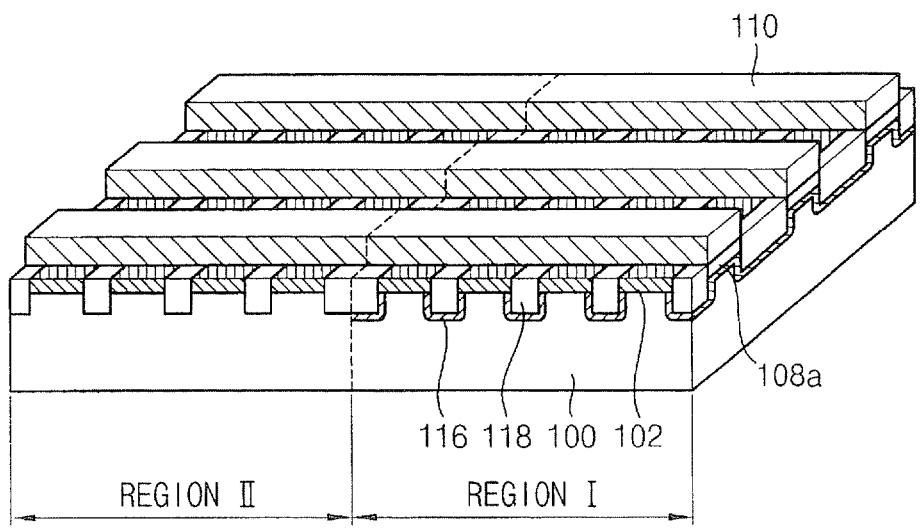

Referring to FIG. 8, a second silicon oxide layer (not illustrated) is formed on the second hard mask pattern 110 and in the opening 112. The silicon oxide layer may include an undoped silicate glass (USG) oxide layer, a plasma enhanced tetra-ethylortho-silicate (PE-TEOS) oxide layer, a high density plasma (HDP) oxide, etc.

Then, the second silicon oxide layer is chemically and mechanically planarized to expose an upper surface of the second hard mask pattern 110. The second silicon oxide layer is partially etched to expose an upper surface of the first hard mask pattern 102. The second silicon oxide layer may be etched by a dry etching process and/or a wet etching process.

As a result, the second silicon oxide layer is changed into a second silicon oxide layer pattern 118 filling up the opening 112 defined by the first and the second hard mask patterns.

Figure 9:
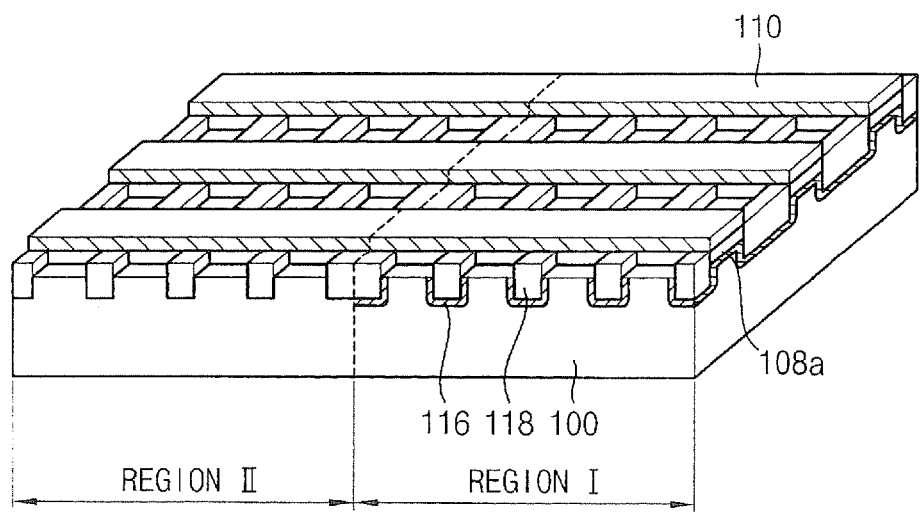

Referring to FIG. 9, the exposed first hard mask pattern 102 is removed.

The removal process may be performed on the first hard mask pattern 102 including silicon nitride by an anisotropic etching process without using an extra etching mask. When the first hard mask pattern 102 is etched, the second hard mask pattern 110 including the material substantially the same as that of the first hard mask pattern 102 is simultaneously etched. Here, because the second hard mask pattern 110 is formed to have a thickness greater than that of the first hard mask pattern 102 by the preceding process of some embodiments, a portion of the second hard mask pattern 110 still remains after completing the etching process.

The first hard mask pattern 102 is removed to expose a surface of the substrate 100 defined by the second silicon oxide layer pattern 118 and the second hard mask pattern 110.

Figure 10:
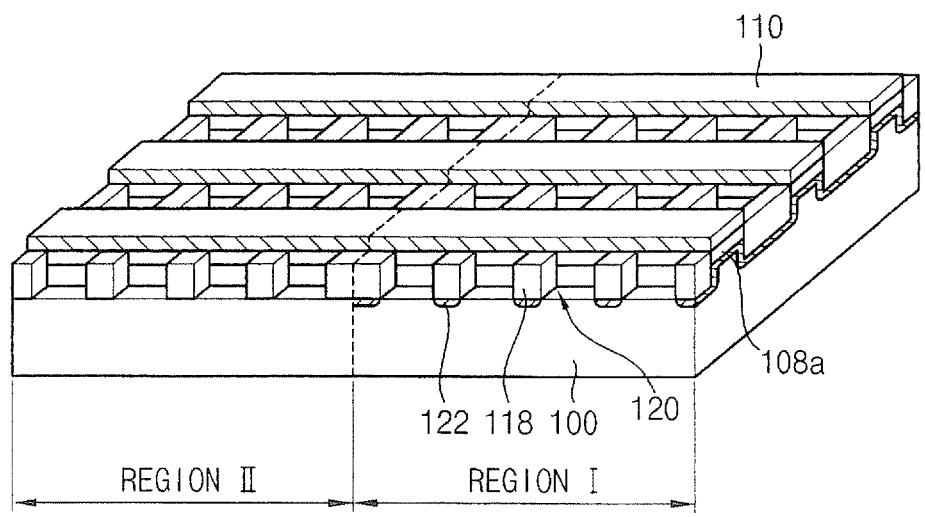

Referring to FIG. 10, the exposed substrate 100 is partially etched to form preliminary trenches 120. A bottom face of the preliminary trenches 120 may be in the same plane as the bottom face of the second silicon oxide layer pattern 118, in some embodiments.

A portion of the second preliminary bit region 116 formed under the surface of the substrate 100 is removed by the etching process.

Accordingly, a bit region 122 into which N-type impurities having a high concentration are doped is formed under the second silicon oxide layer pattern 118 and the first silicon oxide layer pattern 108a. The bit region 122 has a linear shape extending in the first direction. Here, the bit region may be used for a conventional bit line, an impurity region and a bit line contact.

In addition, as a bare substrate is generally doped with P-type impurities having a low concentration, the P-type impurities are doped under the surface of the etched substrate. A portion into which P-type impurities are doped between the bit regions becomes a channel region, in some embodiments.

Then, in order to control a threshold voltage, N-type or P-type impurities may be implanted into the channel region. In order to selectively implant impurities into the channel region, a process for forming a photoresist pattern that selectively masks the second region may be carried out before implanting the impurities. In some embodiments, the impurities are not doped into the second region.

A single unit cell of the NOR flash memory device according to these embodiments of the present invention includes two adjacent bit regions and a channel region therebetween. Further, two data may be stored in the single cell.

Figure 11:
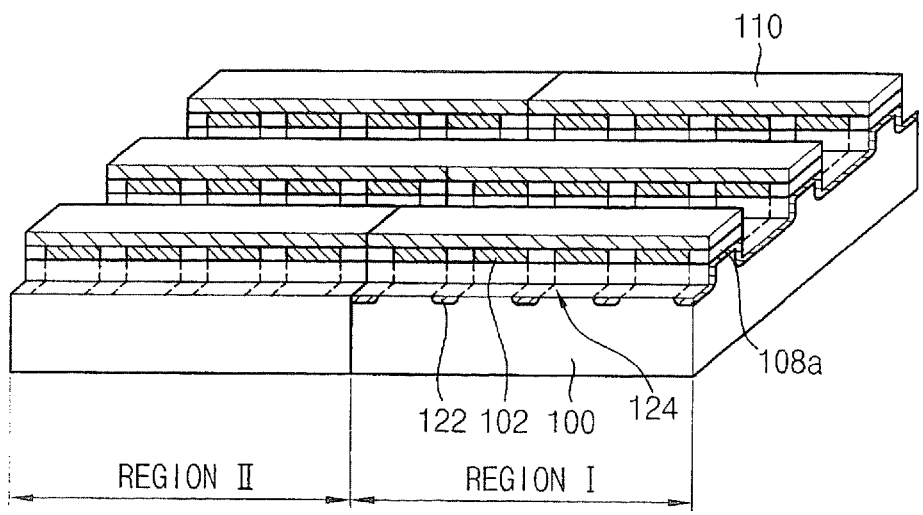

Referring to FIG. 11, the second silicon oxide layer pattern 118 is selectively etched using the second silicon oxide layer pattern 118 as an etching mask.

Accordingly, the second silicon oxide layer pattern 118 is etched to form a trench 124 extending in the first direction on the substrate 100. In addition, a portion of the substrate 100 under the first silicon oxide layer pattern 108a and the second mask pattern 110 have a relatively high stepped portion.

Figure 12:
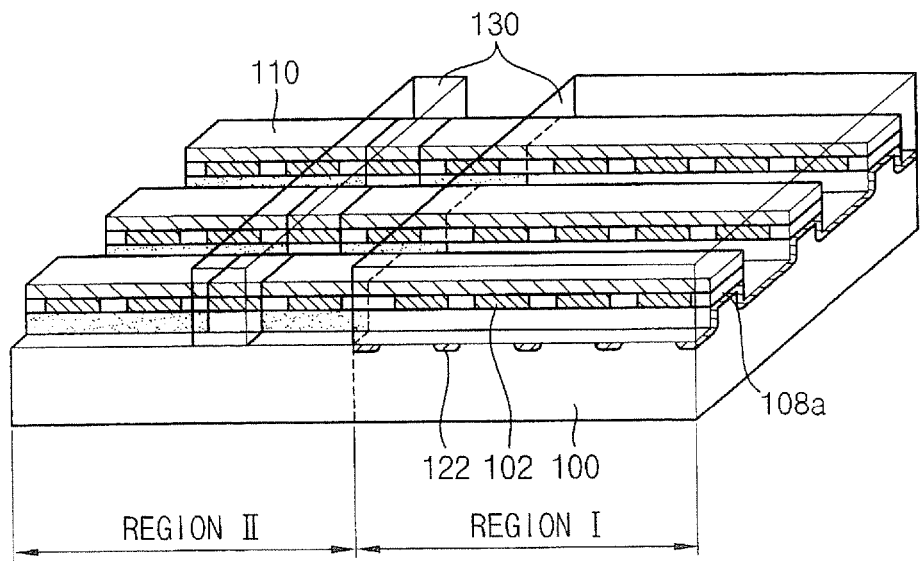

Referring to FIG. 12, a photoresist film (not illustrated) is formed on the substrate having the trench 124. The photoresist film is partially exposed and developed to form a fifth photoresist pattern 130 selectively masking a region that serves as a channel region of the a selection transistor of the second group on the second region. In some embodiments, the fifth photoresist pattern 130 masks the entire first region.

N-type impurities are implanted into first sidewalls of the trench 124 using the fifth photoresist pattern 130 as an ion implantation mask. Particularly, when the impurities are implanted at a specific angle by using the fifth photoresist pattern 130 as an ion implantation mask, the impurities may be hardly implanted into a bottom surface of the trench 124 and the impurities may be implanted into only the first sidewalls of the trench 124.

As a result, source/drain regions and a channel region of the selection transistor of the second group are formed.

Then, the fifth photoresist pattern 130 is removed.

Figure 13:
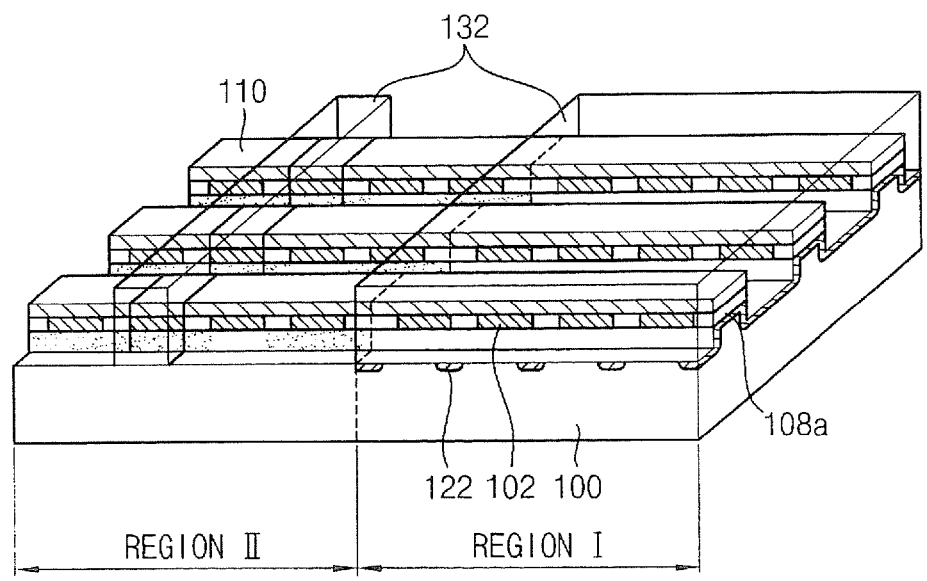

Referring to FIG. 13, a photoresist film is formed on the substrate 100 having the trench 124. The photoresist film is partially exposed and developed to form a sixth photoresist pattern 132 selectively masking a region that serves as a channel region of the selection transistor of the first group on the second region, thereby masking the first region.

N-type impurities are implanted into second sidewalls of the trench 124 using the sixth photoresist pattern 132 as an ion implantation mask. Particularly, when the impurities are implanted at another specific angle using the fifth photoresist pattern 130 as the ion implantation mask, the impurities may be hardly implanted into a bottom surface of the trench 124 and may be implanted into only the second sidewalls of the trench 124.

As a result, source/drain regions and a channel region of the selection transistor of the first group are formed.

Then, the sixth photoresist pattern 132 is removed.

Figure 14:
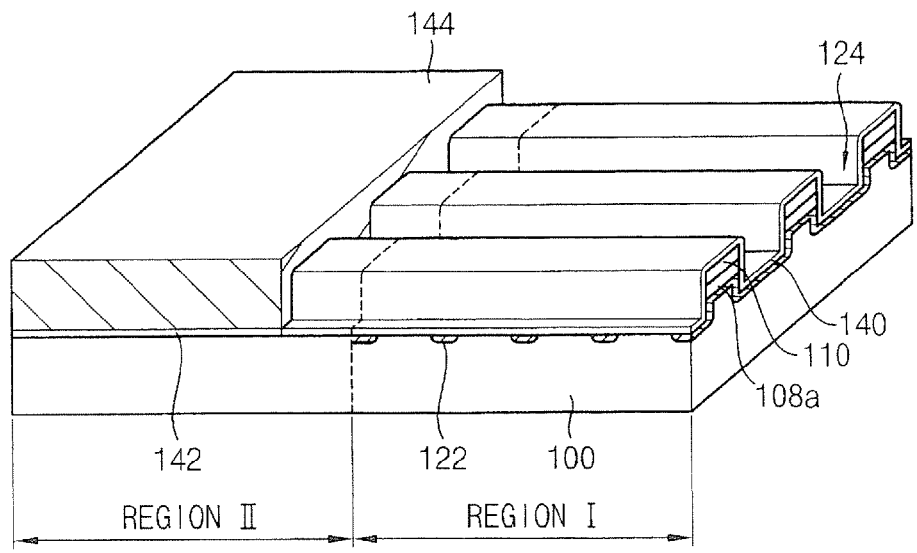

Referring to FIGS. 14 and 17, a stacked structure 140, which includes a first dielectric layer 140a, an electric charge trap layer 140b and a second dielectric layer 140c sequentially stacked, is formed on sidewalls and a bottom face of the trench 124 in the first region.

In these embodiments, the surface of the exposed substrate 100 may be thermally oxidized to form the first dielectric layer 140a. Alternatively, silicon oxide may be deposited by a chemical vapor deposition (CVD) process to form the first dielectric layer 140a. In other embodiments, thermal oxidation and CVD are used.

The electric charge trap layer 140b for trapping electric charges is formed on the first dielectric layer 140a. The electric charge trap layer 140b may include silicon nitride and/or a nanocrystal material. Examples of the nanocrystal material, for example, may include silicon (Si), silicon germanium (SiGe), tungsten (VV), cobalt (Co), molybdenum (Mo), cadmium selenium (CdSe), tungsten nitride (WN), etc.

The second dielectric layer 140c is formed on the electric charge trap layer 140b. The second dielectric layer 140c may be formed by a CVD process.

The stacked structure 140 including the first dielectric layer 140a, the electric charge trap layer 140b and the second dielectric layer 140c may be formed along the profile of the surface of the substrate 100 having the trench 124. That is, the stacked structure 140 does not completely fill up the trench 124.

The electric charge trap layer 140b having a thickness of about 20 Å to about 100 Å may sufficiently trap the electric charges in the electric charge trap layer 140b. Therefore, the stacked structure 140 including the first dielectric layer 140a, the electric charge trap layer 140b and the second dielectric layer 140c may have thickness of about 100 Å to about 300 Å. In the described embodiments, the stacked structure 140 is illustrated as a single layer in FIG. 16.

Then, the first dielectric layer 140a, the electric charge trap layer 140b and the second dielectric layer 140c formed on the second region are removed, successively. A gate oxide layer 142 of the selection transistor of the first and the second groups is selectively formed on the second region by a thermal oxidation process.

A first conductive layer (not illustrated) is formed on the gate oxide layer 142 and the second dielectric layer 140c to fully fill up the trench 124 in some embodiments. The first conductive layer may include a polysilicon material and/or a metal material doped with impurities. Further, the first conductive layer may be formed by an LPCVD process, an ALD process, a physical vapor deposition (PVD) process, a metal organic chemical vapor deposition (MOCVD) process, and so on. In some embodiments, a polysilicon material having an excellent step coverage property may be deposited to form the first conductive layer.

After forming the first conductive layer, an upper surface of the first conductive layer may be additionally planarized.

Then, a seventh photoresist pattern (not illustrated) is formed on the first conductive layer to expose the first region through the seventh photoresist pattern. In these embodiments, the photoresist pattern may also simultaneously expose a portion of the second region adjacent to the first region.

The first conductive layer is removed using the seventh photoresist pattern as an etching mask to form a first conductive layer pattern 144. The conductive layer may be removed by a wet etching process.

Figure 15:
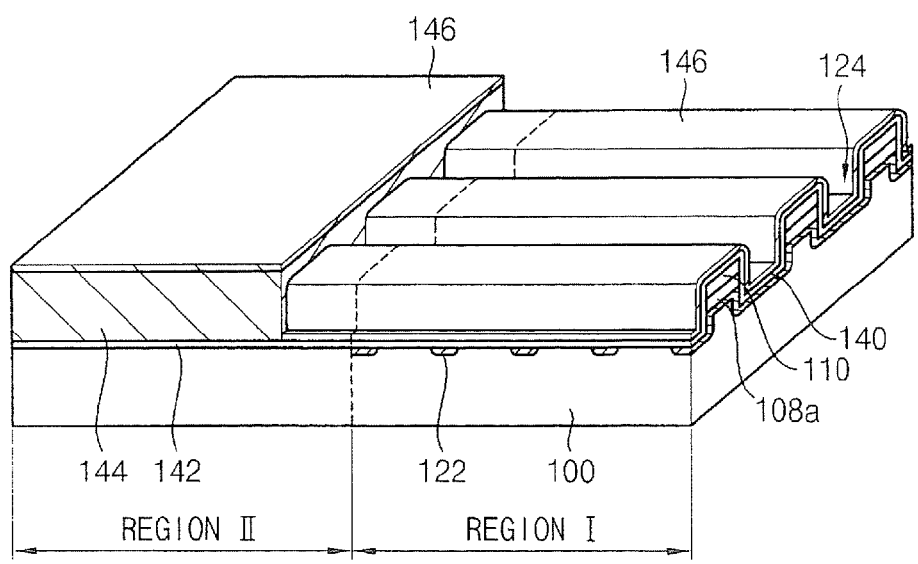

Referring to FIG. 15, a second conductive layer 146 is formed on the first conductive layer pattern 144 and the second dielectric layer 140*c*.

The second conductive layer 146 formed in the first region is formed along the profile of the surface of the substrate 100 having the trench 124. Further, the second conductive layer 146 in the first region may not completely fill up the trench 124. The second conductive layer 146 may comprise a material substantially the same as that of the first conductive layer pattern 144.

Accordingly, whereas the second conductive layer 146 is formed along the profile of the trench in the first region, the first conductive layer pattern 144 and the second conductive layer 146 may be stacked in the second region to completely fill up the trench.

Figure 16:
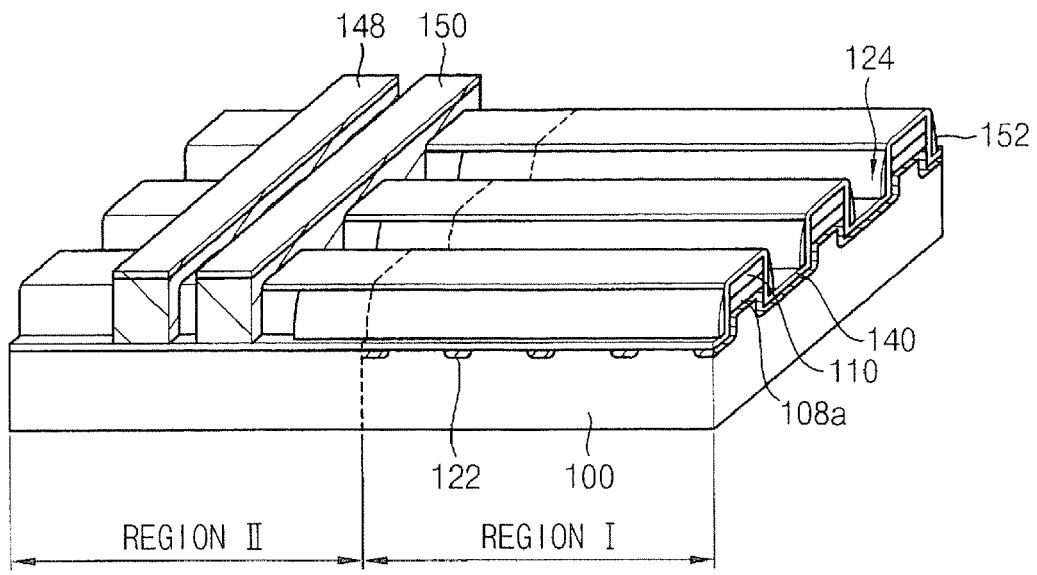
Figure 17:
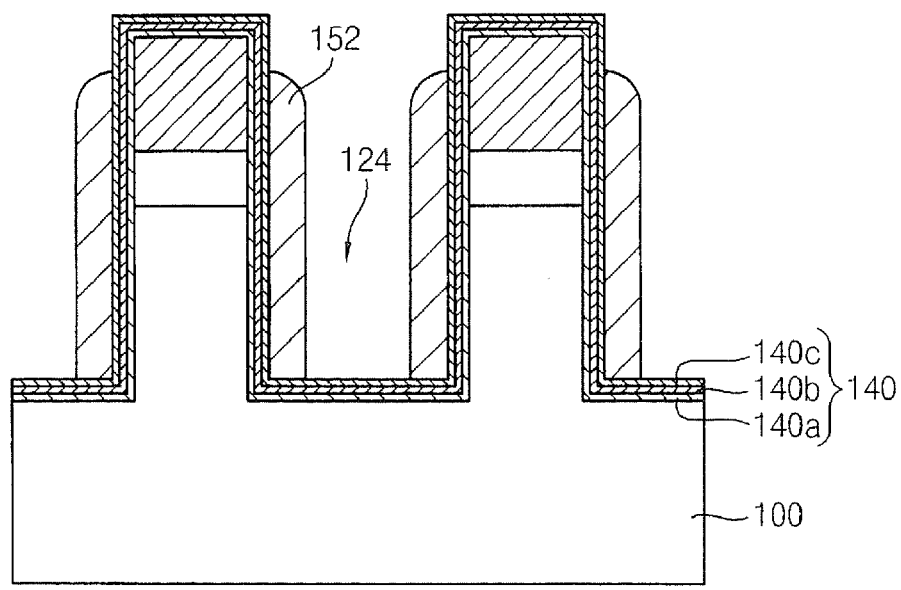
FIG. 17 is a cross-sectional view illustrating a cell of the NOR flash memory device of FIG. 1.

Referring to FIGS. 16 and 17, a photoresist film is formed on the second conductive layer 146. The photoresist film is patterned to form an eighth photoresist pattern (not illustrated). The eighth photoresist pattern is provided as an etching mask for forming gate electrodes of the selection transistors of the first and the second groups on the second region.

Accordingly, the eighth photoresist pattern has a linear shape extending in the second direction and passing through each of channel regions in the second regions. In addition, the eighth photoresist pattern is not formed in the first region.

First and second gate electrode lines 148 and 150 are formed in the second region and an upper electrode 152 having a spacer shape is formed on the sidewalls of the trench 124 by anisotropically etching the first conductive pattern 144 and the second conductive layer 146.

Here, the upper electrode 152 formed in the first region has a thin line width compared with a line width of the upper electrode formed by a conventional photolithography process. In addition, a portion of the substrate, which corresponds to the sidewalls of the trench 124 in the first region, is provided as the bit region 122 and the channel region. The unit cells are controlled by the upper electrode formed on the sidewalls of the trench 124.

Although not illustrated in these figures, a contact 154 (see FIG. 1) for applying external electric signals to the drain regions of the selection transistors may be formed in a contact hole.

In some embodiments, an insulation interlayer is formed to cover the first and the second gate electrode lines 148 and 150, and the upper electrode 152. Then, in order to expose the drain regions of each of the transistors, the insulation interlayer is etched to form the contact hole. Here, the drain regions of two adjacent transistors may be simultaneously exposed through the contact hole. A conductive layer is formed in the contact hole. The conductive layer is then planarized to form the contact.

Figure 18:
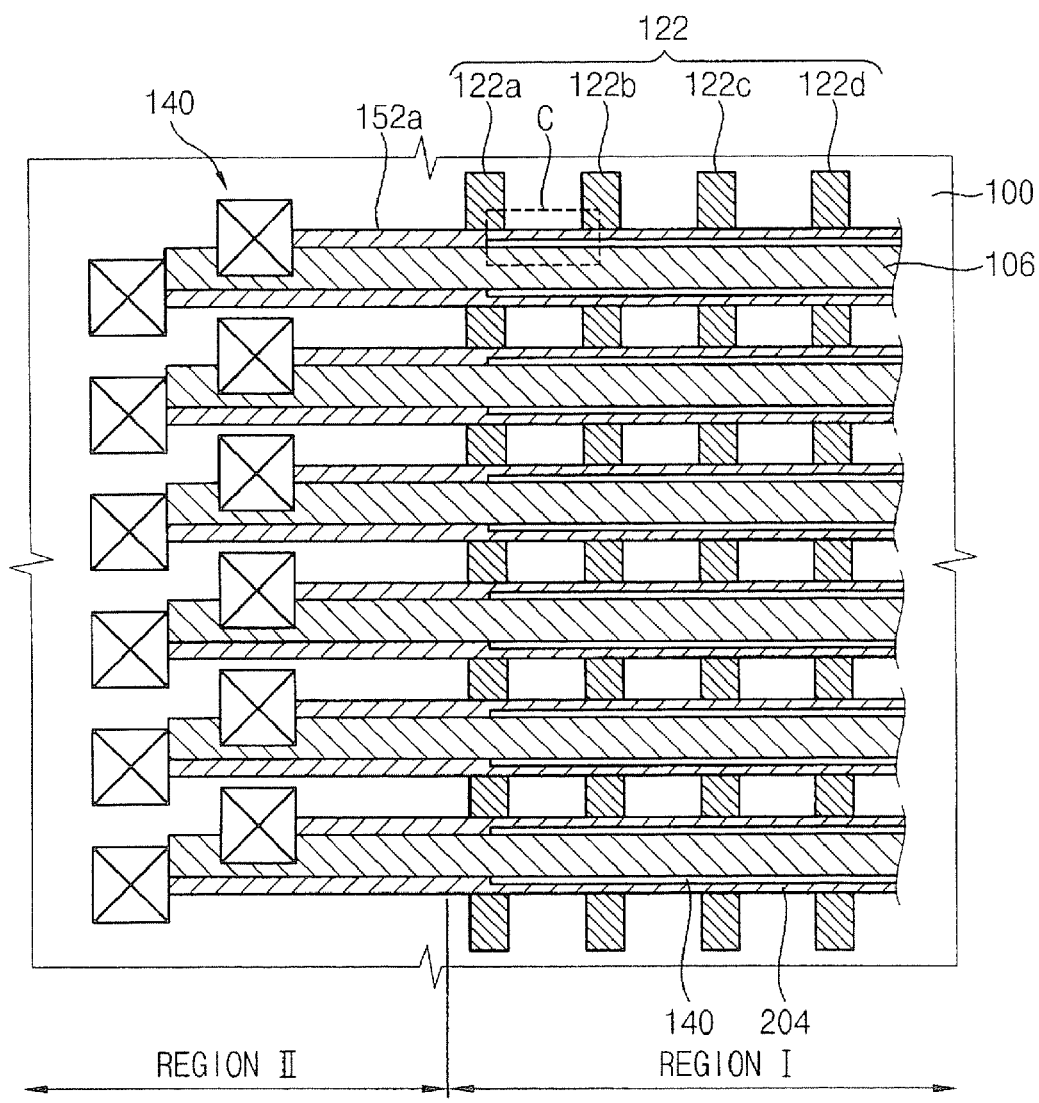
FIG. 18 is a plan view illustrating a NOR flash memory device in accordance with second embodiments of the present invention.

FIG. 18 is a plan view illustrating a NOR flash memory device in accordance with second embodiments of the present invention.

A NOR flash memory in these second embodiments may be substantially the same as that in the first embodiments, except that the selection transistor is not formed and a shape of the contact connected to the upper electrode therein is different from the first embodiments. Accordingly, since each of the unit cells of a NOR flash memory in the second embodiments of the present invention can be substantially the same as that in the first embodiments, their descriptions will be omitted for brevity.

Referring to FIG. 18, the substrate 100 is divided into a first region on which cells for storing data are formed and a second region on which elements for selecting the cells are formed.

Shapes of the unit cells formed on the first region can be substantially the same as those in the first embodiments.

The second region is arranged adjacent to an end portion of the first region. Each upper electrode 152 formed on the first region is extended to the second region. Here, end portions of the upper electrodes 152 may be arranged at positions different from each other.

Particularly, end portions of the upper electrodes 152 formed on the even numbered lines may be arranged at positions different than end portions of the upper electrodes 152 formed on the odd numbered lines.

A contact 160 for applying an external electric signal is connected to the end portion of each the upper electrodes 152. The end portions of the upper electrodes 152 are arranged at positions different from each other, which can provide added space in which the contacts 160 are formed.

According to these embodiments, because each of the upper electrodes 152 is connected to each of the contacts 160 respectively, the selection transistor may not need to be used. Therefore, NOR flash memory devices may be formed by a simpler process.

Hereinafter, a method of manufacturing NOR flash memory devices according to second embodiments of the present invention will be explained in detail.

Figure 19:
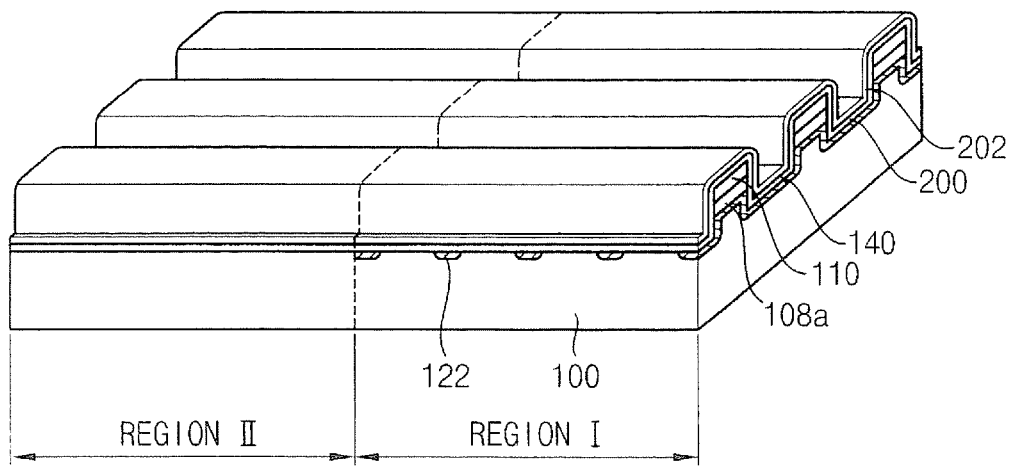
FIGS. 19 to 21 are perspective views illustrating methods of manufacturing a NOR flash memory device of FIG. 18.
Figure 20:
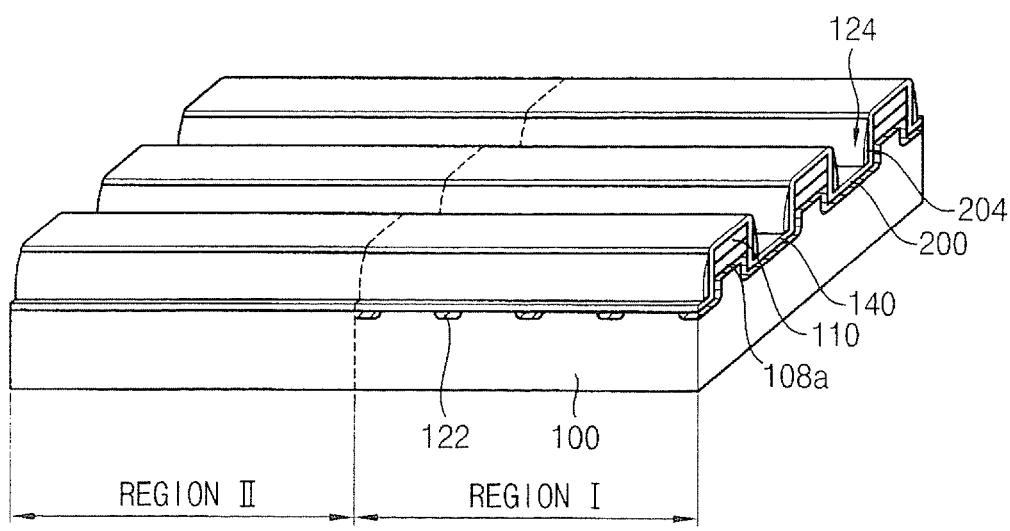
Figure 21:
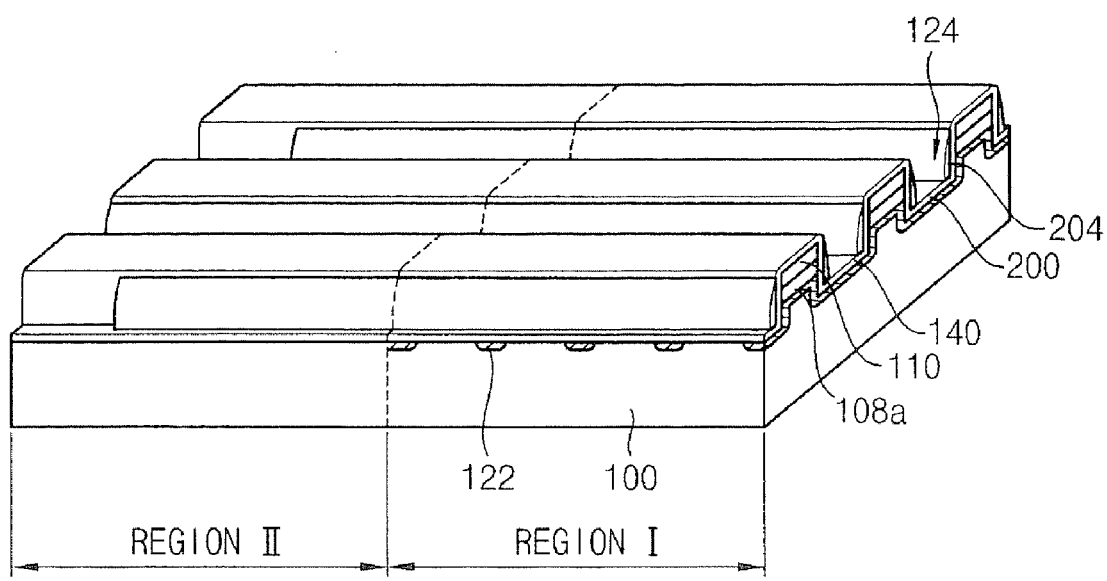

FIGS. 19 to 21 are perspective views illustrating a NOR flash memory device shown in FIG. 18.

The substrate having the trenches and the stepped portions may be formed by the same process illustrated in FIGS. 3 to 11. The bit region extending in the second direction is formed under the surface of the substrate.

Referring to FIG. 19, a first dielectric layer used for a tunnel oxide layer is formed on the sidewalls and the bottom face of the trench 124.

An electric charge trap layer for trapping electric charges is formed on the first dielectric layer. The electric charge trap layer may include silicon nitride and/or a nanocrystal material.

A second dielectric layer is formed on the electric charge trap layer. The second dielectric layer may be deposited by a chemical vapor deposition (CVD) process.

A stacked structure 200 including the first dielectric layer, the electric charge trap layer and the second dielectric layer may be formed along the profile of the surface of the substrate having the trench 124. The stacked structure 200 does not fill up the trench 124, completely.

A conductive layer 202 is formed on the second dielectric layer not to completely fill up the trench 124. The conductive layer 202 may include a polysilicon material and/or metal material doped with impurities. The conductive layer 202 may be formed by an LPCVD process, an ALD process, a physical vapor deposition (PVD) process, a metal organic chemical vapor deposition (MOCVD) process, etc. In some embodiments, a polysilicon material having an excellent step coverage property may be deposited to form the conductive layer 202.

Referring to FIG. 20, the conductive layer 202 is anisotropically etched to form an upper electrode 204 having a spacer shape on the sidewalls of the trench 124 in the first and the second regions.

In some embodiments, the upper electrode 204 formed in the first region has a thin line width compared with a line width of the upper electrode formed by a conventional photolithography process. Additionally, a portion of the substrate, which corresponds to the sidewalls of the trench 124 in the first region, is provided as the bit region 122 and the channel region. The unit cells are controlled by the upper electrode 204 formed on the sidewalls of the trench 124.

Referring to FIG. 21, a photoresist pattern (not illustrated) is formed on the substrate including the upper electrodes 204 formed thereon. The photoresist pattern serves as an etching mask pattern during an etch process, where the end portions of the upper electrode extending to the second region are formed to be arranged at positions different from each other. The photoresist pattern partially exposes the upper electrode formed in the second region and completely covers the first region.

Then, the one end portion of the upper electrode 204 is partially removed using the photoresist pattern as an etching mask. The removal process may be performed by a wet etching process.

The end portions of the upper electrodes 204 extending to the second region are formed to be arranged at positions different from each other by the removal process. According to these embodiments of the present invention, end portions of the upper electrodes formed on the even numbered lines may be arranged at positions different from end portions of the upper electrodes formed on the odd numbered lines.

Although not illustrated in figures, a contact connected to the upper electrode 204 is formed.

Particularly, an insulation interlayer (not shown) is formed to cover the upper electrode 204. The insulation interlayer is partially etched to form a contact hole through which the one end portion of the upper electrodes 204 extending to the second region is exposed.

As the end portions of the adjacent upper electrodes 204 are arranged at positions differently from each other, the contact holes are arranged in a zigzag configuration. Therefore, even though each of the adjacent upper electrodes is closely arranged relative to each other, the contact holes may not make contact with each other, and thus sufficient margins may be secured.

A conductive layer is deposited to fill up the contact hole, and the conductive layer is planarized to form the contact 160.

According to some embodiments of the present invention, the channel region is formed under sidewalls of the trenches in the substrate and the upper electrodes having the spacer shape is formed on the sidewalls of the trenches, to thereby allow increased integration density of the NOR flash memory devices.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A memory device comprising:
    a substrate including closely spaced apart trenches that extend in a first direction to define closely spaced apart pedestals therebetween that extend in the first direction, a respective pedestal including opposing sidewalls and a pedestal top therebetween, the trench having first and second sidewalls opposite to each other;
    a plurality of closely spaced apart bit lines in the substrate having a linear shape that extend in a second direction substantially perpendicular to the first direction across the spaced apart trenches and across the pedestals therebetween and that extend in a respective pedestal along the opposing sidewalls and along the pedestal top;
    a plurality of closely spaced apart electrodes on the plurality of opposing sidewalls that extend in the first direction and that are thicker remote from the pedestal tops than adjacent the pedestal tops, wherein a first electrode of the electrodes is on the first sidewall of the trench, a second electrode of the electrodes is on the second sidewall of the trench, and the first and second electrodes are spaced apart from each other; and
    a plurality of memory cells located at intersections of the bit lines and the electrodes.

2. The memory device of claim 1 wherein the memory cells include a charge trap region.

3. The memory device of claim 2 further comprising:
    a first insulating layer that extends on the trenches and on the pedestals, including on the opposing sidewalls and pedestal tops thereof;
    a charge trap layer on the first insulating layer; and
    a second insulating layer on the charge trap layer;
    wherein the closely spaced apart electrodes are on the second insulating layer on the plurality of opposing sidewalls and wherein the charge trap layer defines the charge trap region.

4. The memory device of claim 3 further comprising:
    a third insulating layer on the pedestal tops; and
    a mask layer on the third insulating layer;
    wherein the first insulating layer is on the mask layer on the pedestal tops.

5. The memory device of claim 1 wherein alternating ones of the plurality of closely spaced apart electrodes on the plurality of opposing sidewalls extend in the first direction for alternating different distances.

6. The memory device of claim 1 further comprising an array of common contacts, a respective one of which electrically connects a pair of closely spaced apart electrodes on facing sidewalls of adjacent pedestals.

7. The memory device of claim 1 further comprising an array of contacts, a respective one of which electrically connects a respective one of the closely spaced apart electrodes.

8. The memory device of claim 1 wherein the electrodes monotonically increase in thickness from adjacent the pedestal tops to remote from the pedestal tops.

9. The memory device of claim 1 wherein the electrodes have a cross-sectional shape of a gate sidewall spacer of a field effect transistor.

10. The memory device of claim 1 wherein the substrate, bit lines, electrodes and/or memory cells are configured to provide a NOR flash memory device.

11. A memory device comprising:
a substrate including closely spaced apart trenches that extend in a first direction to define closely spaced apart pedestals therebetween that extend in the first direction, a respective pedestal including opposing sidewalls and a pedestal top therebetween, the trench having first and second sidewalls opposite to each other;
a plurality of closely spaced apart bit lines in the substrate having a linear shape that extend in a second direction substantially perpendicular to the first direction across the spaced apart trenches and across the pedestals therebetween and that extend in a respective pedestal along the opposing sidewalls and along the pedestal top;
a plurality of closely spaced apart electrodes on the plurality of opposing sidewalls that extend in the first direction and that are thicker remote from the pedestal tops than adjacent the pedestal tops, wherein a first electrode of the electrodes is on the first sidewall of the trench, a second electrode of the electrodes is on the second sidewall of the trench, and the first and second electrodes are spaced apart from each other;
a plurality of memory cells located at intersections of the bit lines and the electrodes; and
an insulation layer pattern and a mask pattern on the pedestal of the substrate.

12. The memory device of claim 11 wherein the memory cells include a charge trap region.

13. A NOR flash memory device, comprising:
a substrate having trenches that extend in a first direction and stepped portions that are arranged between the trenches, the trench having first and second sidewalls opposite to each other;
a plurality of bit regions having a linear shape that extends in a second direction substantially perpendicular to the first direction in the substrate across the trenches, the bit region being doped with impurities;
a first dielectric layer on the substrate having the trenches;
a charge trap layer on the first dielectric layer;
a second dielectric layer on the charge trap layer; and
a plurality of upper electrodes on the first and second sidewalls of the trenches, the upper electrode extending in the first direction, the upper electrode having a sidewall spacer shape, wherein a first electrode of the electrodes is on the first sidewall of the trench, a second electrode of the electrodes is on the second sidewall of the trench, and the first and second electrodes are spaced apart from each other.

14. The NOR flash memory device of claim 13, wherein one pitch of a single trench and a single stepped portion has a length of at least twice a minimum line width of the device.

15. The NOR flash memory device of claim 13, wherein the bit region comprises impurities in the sidewalls and a bottom surface of the trench and a surface of the stepped portion.

16. The NOR flash memory device of claim 13, further comprising an insulation layer pattern and a mask pattern on the stepped portion of the substrate.

17. The NOR flash memory device of claim 13, further comprising contacts on end portions of the upper electrodes to apply a signal to the upper electrodes.

18. The NOR flash memory device of claim 17, wherein the end portions of the upper electrodes are arranged at positions different from each other.

19. The NOR flash memory device of claim 13, further comprising:
selection transistors arranged on the end portions of the upper electrodes and connected to the upper electrodes; and
contacts that are configured to apply a signal to the selection transistors.

20. The NOR flash memory device of claim 19, wherein a given contact is simultaneously connected to impurity regions of at least two adjacent selection transistors.

21. A method of manufacturing a NOR flash memory device, comprising:
etching a substrate to form trenches extending in a first direction and stepped portions between the trenches, the trench having first and second sidewalls opposite to each other;
doping impurities into the substrate to form a plurality of bit regions having a linear shape that extends in a second direction substantially perpendicular to the first direction across the trenches;
successively forming a first dielectric layer, a charge trap layer and a second dielectric layer on the substrate having the trenches; and
forming a plurality of upper electrodes having a spacer shape on the first and second sidewalls of the trenches, the upper electrode extending in the first direction, wherein a first electrode of the electrodes is formed on the first sidewall of the trench, a second electrode of the electrodes is formed on the second sidewall of the trench, and the first and second electrodes are spaced apart from each other.

22. The method of claim 21, wherein one pitch of a single trench and a single stepped portion has a length substantially the same as a minimum line width of the manufacturing method.

* * * * *